United States Patent
Miers et al.

(10) Patent No.: US 11,271,309 B2
(45) Date of Patent: Mar. 8, 2022

(54) SYSTEMS AND METHODS FOR INTERCONNECTING AND ISOLATING ANTENNA SYSTEM COMPONENTS

(71) Applicant: Ball Aerospace & Technologies Corp., Boulder, CO (US)

(72) Inventors: Zachary T. Miers, Broomfield, CO (US); Joseph E. Diener, Westminster, CO (US); Peter J. Moosbrugger, Lafayette, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 275 days.

(21) Appl. No.: 16/443,286

(22) Filed: Jun. 17, 2019

(65) Prior Publication Data

US 2020/0053870 A1 Feb. 13, 2020

Related U.S. Application Data

(60) Provisional application No. 62/717,590, filed on Aug. 10, 2018, provisional application No. 62/717,534, filed on Aug. 10, 2018.

(51) Int. Cl.
| | |
|---|---|
| *H01Q 9/04* | (2006.01) |
| *H05K 1/02* | (2006.01) |
| *H05K 1/11* | (2006.01) |
| *H01Q 21/06* | (2006.01) |

(Continued)

(52) U.S. Cl.
CPC ............ *H01Q 9/0407* (2013.01); *H01Q 1/52* (2013.01); *H01Q 21/0087* (2013.01); *H01Q 21/065* (2013.01); *H05K 1/0243* (2013.01); *H05K 1/116* (2013.01)

(58) Field of Classification Search
CPC .......... H01Q 1/36; H01Q 1/52; H01Q 9/0407; H01Q 9/0421; H01Q 9/0435; H01Q 9/0442; H01Q 9/0457; H01Q 9/045; H01Q 21/0087; H01Q 21/065; H01Q 23/00; H01Q 1/38; H05K 1/0222; H05K 1/0251;

(Continued)

(56) References Cited

U.S. PATENT DOCUMENTS

| | | |
|---|---|---|
| 2004/0012533 A1 | 1/2004 | Navarro et al. |
| 2005/0104783 A1 | 5/2005 | Kojima |
| 2006/0055517 A1 | 3/2006 | Ghabra et al. |

(Continued)

OTHER PUBLICATIONS

International Preliminary Report on Patentability for International (PCT) Patent Application No. PCT/US2019/041589, dated Feb. 25, 2021 10 pages.

(Continued)

*Primary Examiner* — Robert Karacsony
(74) *Attorney, Agent, or Firm* — Sheridan Ross P.C.

(57) ABSTRACT

An antenna system circuit board stack with feed vias and with non-feed vias is disclosed. An antenna system circuit board stack as disclosed herein can include a plurality of patches or radiating elements formed on a common plane comprising a first surface of a circuit board. Each radiating element is electrically connected to one or more feed vias. In addition non-feed vias extend through, but are electrically isolated from, the radiating elements. An antenna system as disclosed herein enables the costs associated with multiple beam antenna systems, including but not limited to 5G communication systems, to be reduced as compared to alternative techniques.

20 Claims, 4 Drawing Sheets

(51) Int. Cl.
  *H01Q 21/00* (2006.01)
  *H01Q 1/52* (2006.01)
(58) Field of Classification Search
  CPC ...... H05K 1/0243; H05K 1/115; H05K 1/116; H05K 3/429; H05K 2201/10098
  See application file for complete search history.

(56) References Cited

U.S. PATENT DOCUMENTS

| | | |
|---|---|---|
| 2007/0115178 A1 | 5/2007 | Chi et al. |
| 2007/0229358 A1 | 10/2007 | Chi et al. |
| 2008/0012774 A1 | 1/2008 | Wang |
| 2009/0146886 A1 | 6/2009 | Yoshioka et al. |
| 2009/0195474 A1 | 8/2009 | Chien et al. |
| 2009/0256777 A1 | 10/2009 | Nagai |
| 2010/0289706 A1 | 11/2010 | Hsieh et al. |
| 2010/0297952 A1 | 11/2010 | Rofougaran |
| 2011/0057851 A1 | 3/2011 | Chung et al. |
| 2011/0122043 A1 | 5/2011 | Ridgeway |
| 2011/0193752 A1 | 8/2011 | Wang et al. |
| 2011/0291011 A1 | 12/2011 | Chang et al. |
| 2012/0025848 A1 | 2/2012 | Hasch et al. |
| 2012/0026133 A1 | 2/2012 | Rofougaran |
| 2012/0119954 A1 | 5/2012 | Chen |
| 2012/0212380 A1 | 8/2012 | Theobold et al. |
| 2012/0229346 A1 | 9/2012 | Chen et al. |
| 2012/0280380 A1 | 11/2012 | Kamgaing |
| 2013/0135173 A1 | 5/2013 | Ridgeway |
| 2013/0135836 A1 | 5/2013 | Roberts et al. |
| 2014/0145883 A1 | 5/2014 | Baks et al. |
| 2014/0184460 A1 | 7/2014 | Yen |
| 2014/0218252 A1 | 8/2014 | Ridgeway |
| 2014/0292601 A1 | 10/2014 | Kim et al. |
| 2015/0022404 A1 | 1/2015 | Chen et al. |
| 2015/0340765 A1 | 11/2015 | Dang et al. |
| 2016/0056544 A1 | 2/2016 | Garcia et al. |
| 2016/0172761 A1 | 6/2016 | Garcia et al. |
| 2016/0240495 A1 | 8/2016 | Lachner et al. |
| 2016/0352023 A1 | 12/2016 | Dang et al. |
| 2017/0317418 A1 | 11/2017 | Garcia et al. |
| 2017/0352960 A1 | 12/2017 | Zhang |
| 2018/0076526 A1 | 3/2018 | Garcia et al. |
| 2018/0159203 A1 | 6/2018 | Baks et al. |
| 2018/0233465 A1 | 8/2018 | Spella et al. |
| 2018/0248254 A1 | 8/2018 | Islam et al. |
| 2018/0309198 A1 | 10/2018 | Yu et al. |
| 2019/0013592 A1 | 1/2019 | West et al. |
| 2019/0131717 A1 | 5/2019 | Vannucci et al. |
| 2019/0131718 A1 | 5/2019 | Vannucci et al. |
| 2019/0167747 A1 | 6/2019 | Carle |

OTHER PUBLICATIONS

Dong et al. "Compact Circularly-Polarized Patch Antenna Loaded With Metamaterial Structures," IEEE Transactions on Antennas and Propagation, Nov. 2011, vol. 59, No. 11, pp. 4329-4333.

Nasimuddin et al. "A Compact Circularly Polarized Slotted Patch Antenna for GNSS Applications," IEEE Transactions on Antennas and Propagation, Dec. 2014, vol. 62, No. 12, pp. 6506-6509.

International Search Report and Written Opinion for International (PCT) Patent Application No. PCT/US2019/041589, dated Oct. 10, 2019 16 pages.

SYSTEMS AND METHODS FOR INTERCONNECTING AND ISOLATING ANTENNA SYSTEM COMPONENTS

CROSS-REFERENCE TO RELATED APPLICATIONS

This application claims the benefit of U.S. Provisional Patent Application Ser. No. 62/717,534, filed Aug. 10, 2018, and U.S. Provisional Patent Application Ser. No. 62/717,590, filed Aug. 10, 2018, the entire disclosures of which are hereby incorporated herein by reference.

FIELD

The present disclosure is directed to antenna systems having vias and a radiating element that are formed in the same area of a circuit board.

BACKGROUND

Radio frequency (RF) communication links are increasingly being used to transfer information and to control devices. As the importance and sophistication of wireless communications systems increases, the number of connected devices, and of base stations and other infrastructure, will increase dramatically. This increase is set to be accelerated by the adoption of higher frequency, shorter range systems, such as 5G cellular communications systems. With the expected growth in infrastructure, and in view of the desire to contain costs, one important consideration in designing and implementing RF circuits is the expense of manufacturing such circuits. In addition, maintaining adequate levels of performance, particularly at higher operating frequencies, while containing costs, for example by maintaining isolation between signals, is an important consideration. However, such considerations have often proven to be mutually exclusive.

In many antenna systems, planar patch type conductors, formed on one or more layers of circuit board, are used as radiating or antenna elements. Electrical connections between conductors or elements on different layers of a circuit board stack are commonly established using vertical interconnects or vias that extend across one or more layers of the circuit board stack. In such systems, the ability to form conductive vias, also referred to herein simply as vias, to connect signal lines or conductors on different layers of the circuit board or to provide ground vias for isolation of signals has been limited. In particular, because the RF characteristics of the radiating elements are affected by their area and geometry, conductive vias that are not used to deliver signals to the radiating elements have been required to be limited to layers or areas of the circuit board that do not include radiating elements. Limiting vias to areas that are not overlaid by radiating elements is impractical. However, forming vias that extend through less than the entire circuit board stack (i.e. through less than all of the circuit board layers) so that they don't intersect radiating elements greatly increases the complexity and cost of manufacturing the circuit assembly. For instance, back drilling, multiple drill cycles, the use of conductive adhesives, additional lamination cycles, and other time-consuming and difficult to implement techniques for forming vias have been required.

SUMMARY

Embodiments of the present disclosure provide antenna assemblies and methods of forming antenna assemblies that enable vias to be formed in areas of a circuit board stack that include or are overlaid by radiating elements, without requiring the use of vias that extend through less than the entire circuit board stack.

In accordance with at least some embodiments of the present disclosure, antenna systems are provided that include vias that are not directly connected to the radiating element, but that are nevertheless formed in an area and in a layer of a circuit board stack that includes the radiating element. These additional vias, hereinafter referred to as stackup vias or non-feed vias, can include vias that are not directly related to the operation of the radiating element, at least because they are not provided for carrying a signal between the radiating element and a transceiver. Because the non-feed vias extend through the entire depth of the stack, they can be formed easily and inexpensively. In accordance with at least some embodiments of the present disclosure, the non-feed vias can be formed after the radiating element has been formed on the circuit stack. In accordance with further embodiments of the present disclosure, the non-feed vias can be formed using drill holes that extend through the entire circuit board stack, without requiring the use of back drilling or additional lamination cycles. Moreover, a non-feed via as described herein can extend beyond a surface on which a radiating element intersected by the non-feed via is disposed. For instance, the non-feed via can extend to a level of an outer surface of the radiating element.

In accordance with at least some other embodiments of the present disclosure, non-feed vias as described herein can include vias that interconnect signal lines, pads, ground planes, non-radiating components, or any other conductor or component to a different or like conductor or component. Moreover, non-feed vias as described herein can include ground or isolation vias. Such ground or isolation vias can be connected to a ground conductor or ground plane at one or multiple levels of the circuit board stack.

In accordance with embodiments of the present disclosure, a non-feed via is formed by drilling thorough an entire antenna circuit board stack, including through a patch or radiating element formed on one surface of the circuit board stack. A relieved area or anti-pad is formed in the radiating element in an area around the non-feed via. The relieved area provides separation between the electrical conductor of the non-feed via and the radiating element. Accordingly, there is no direct electrical contact between the radiating element and the non-feed via. In accordance with further embodiments of the present disclosure, a single aperture or area of relief formed in the radiating element can encompass a plurality of non-feed vias. The areas of relief can be formed by removing the conductive material of the radiating element in that area of relief. An antenna circuit board stack can include a feed via directly electrically connected to the radiating element, in addition to a non-feed via. In accordance with still other embodiments, an antenna circuit board stack can include one or more ground vias, in addition to a feed via and a non-feed via.

Additional features and advantages of embodiments of the disclosed systems and methods will become more readily apparent from the following description, particularly when taken together with the accompanying drawings.

DETAILED DESCRIPTION

Figure 1:
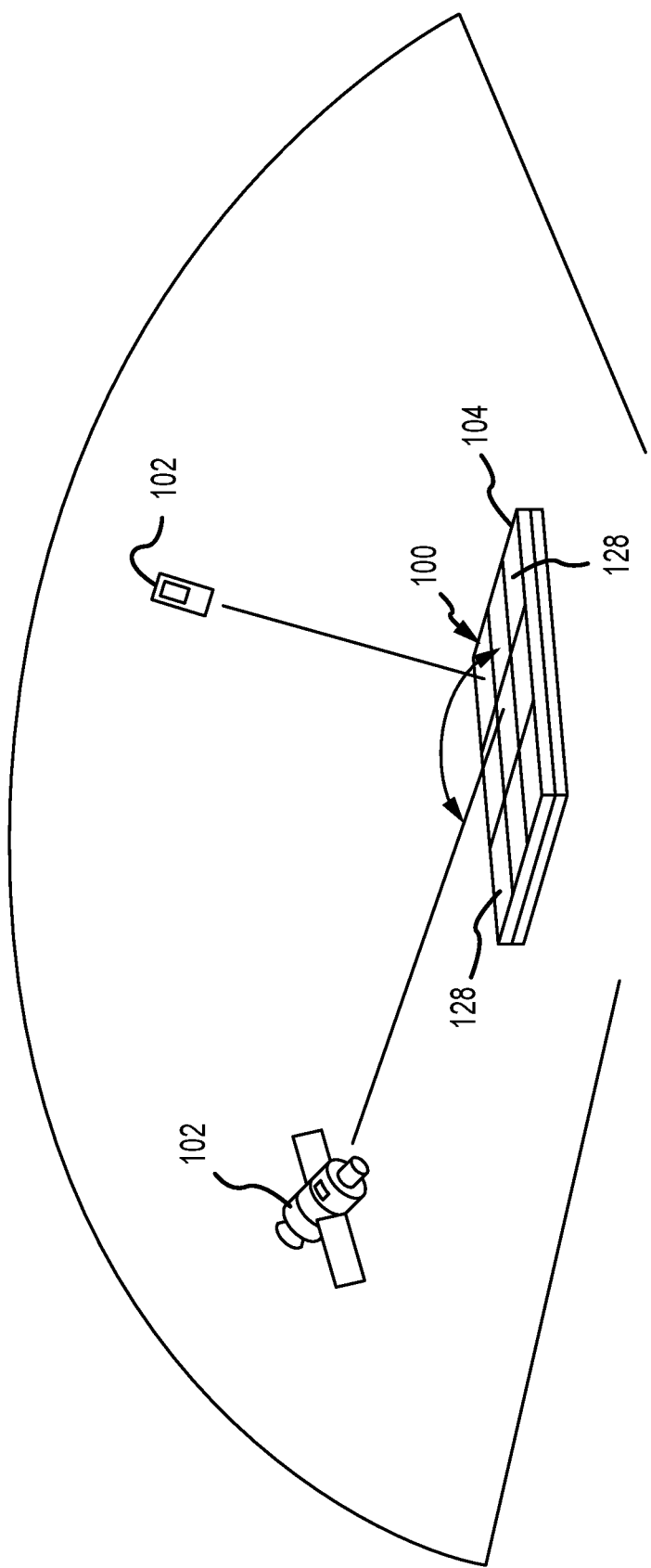
FIG. 1 depicts an antenna system in accordance with embodiments of the present disclosure in an example operational scenario.

FIG. 1 depicts an antenna system or assembly 100 in accordance with embodiments of the present disclosure in an example operational scenario. The antenna system 100 can include a circuit board stack 104 on which a plurality of radiating elements 128 are disposed, thereby forming a planar phased array. The antenna assembly 100 can be used in various applications, including but not limited to communications with remote devices 102 as part of a satellite, 5G, other communications systems, or in any other RF system utilizing radiator elements 128 formed on a circuit board stack 104.

Figure 2:
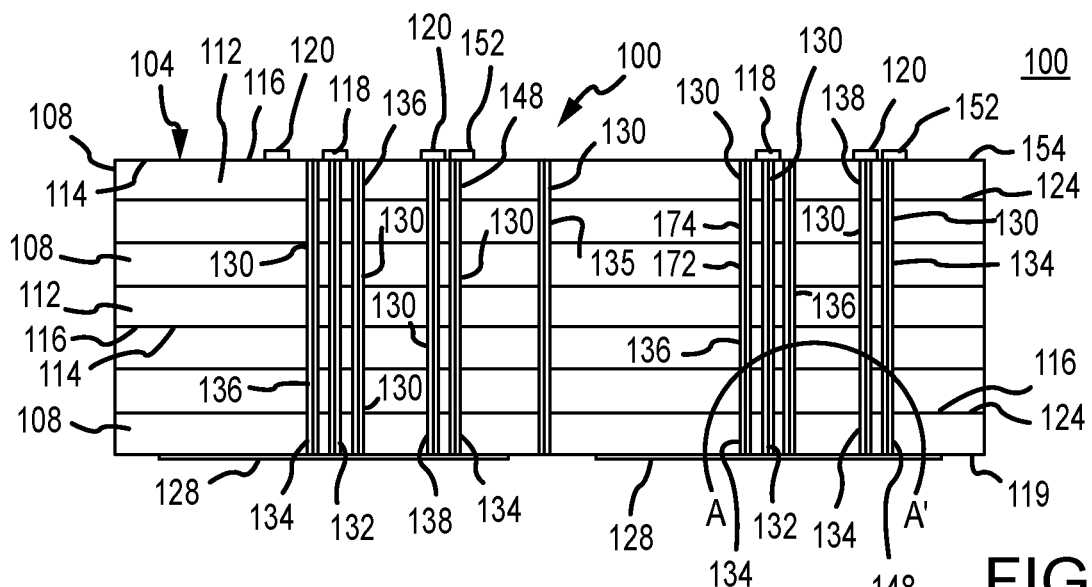
FIG. 2 is a cross-sectional view in elevation of a circuit board stack including antenna radiating elements, feed vias, and non-feed vias in accordance with embodiments of the present disclosure.

A detail of an antenna assembly 100 incorporating a circuit board stack 104 in accordance with embodiments of the present disclosure is depicted in cross section in FIG. 2. As can be appreciated by one of skill in the art after consideration of the present disclosure, the circuit board stack 104 can include multiple circuit board layers 108. Each circuit board layer 108 can include an insulating material or substrate 112 and a conductive material 116 on all or portions of at least one surface 114 of the insulating material 112. As can be appreciated by one of skill in the art after consideration of the present disclosure, the surface 114 on which the conductive material 116 lies is generally planar. The conductive material 116 can be configured to form feed lines 118. In addition, the conductive material 116 can be configured to form one or more signal lines, power transmission lines, or other conductors or lines 120. The conductive material 116 can also form ground planes 124. The antenna assembly 100 further includes antenna radiating elements 128, which can be formed on a first or radiating side or surface 119 of the circuit board stack 104 from the conductive material 116 of a circuit board layer 108, or as a separate conductive patch or component applied or connected to the first surface 119.

Figure 3:
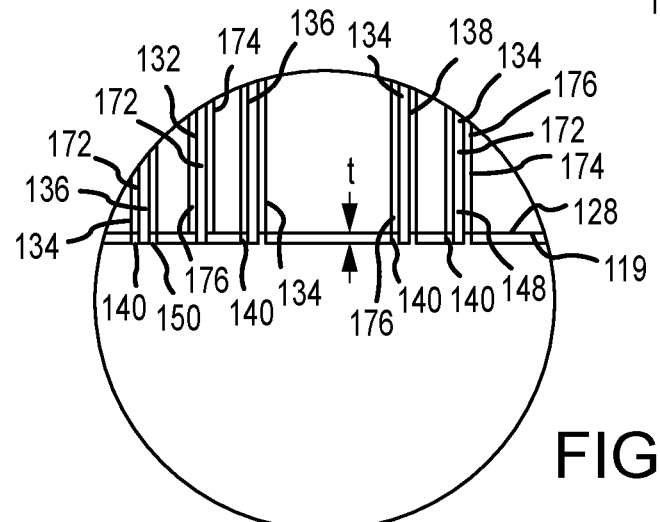
FIG. 3 is a detail taken from the area within arc A-A' in FIG. 2.

In accordance with embodiments of the present disclosure, the antenna assembly 100 also includes one or more vias 130. The vias 130 can include feed or signal vias 132 and non-feed vias 134. As can be appreciated by one of skill in the art, and as illustrated in FIG. 3, a via 130, also known as a vertical interconnect access, includes an electrical conductor 172 extending along a hole 174 that traverses multiple circuit board layers 108 of a circuit board stack 104. A via can serve to electrically connect feed lines 118, non-feed lines 120, and/or components on different layers of the circuit board stack 104 to one another. In a typical implementation, the hole 174 of a via 130 is generally perpendicular to the plane of a surface 114 of a circuit board layer 108 through which the via 130 extends. The electrical conductor 172 can be separated from the walls of the hole 174 (e.g. from surfaces of the circuit boards 108 through which the hole extends) by an insulator material 176.

A feed via 132 in accordance with embodiments of the present disclosure carries RF signals between an associated feed line 118 and a radiating element 128. Accordingly, each of the feed vias 132 is directly electrically connected to an associated radiating element 128.

Embodiments of the present disclosure also include non-feed vias 134, such as ground vias 136, interlayer connection vias 138, and component vias 148, that are not directly electrically connected to a radiating element 128, even though such non feed vias 134 can be located within holes 174 formed along lines that intersect a radiating element 128. Ground vias 136 are an example of a passive non-feed via 134. Ground or isolation vias 136 can be electrically connected to one or more ground planes 124, can be located so as to isolate the feed vias 132 thereby preventing or limiting the propagation of interfering signals within the layers 108 of the circuit board stack 104, and/or can be configured to ground a component of the antenna assembly 100. Interlayer connection vias 138 can interconnect signal lines 120 formed on different circuit board layers 108 to one another. Component vias 148 can be provided to interconnect non-radiating components 152 mounted to the second or non-radiating side or surface 154 of the circuit board stack 104 to signal lines, power transmission lines, or the like that are at least partially formed as part of or on other circuit board layers 108 within the circuit board stack 104. Examples of non-radiating components 152 include integrated circuits, resistors, phase shifters, interconnects, or other devices or components.

In addition to non-feed vias 134 formed along lines that intersect a radiating element 128, embodiments of the present disclosure can include non-feed vias 134 associated with holes 174 that extend through the entire circuit board stack 104 and that are located conventionally, along lines that do not intersect a radiating element 128. An example of a non-feed via 134 that does not intersect a radiating element 128 is non-feed via 135 (see FIG. 2).

In accordance with embodiments of the present disclosure, the feed vias 132 and the non-feed vias 134 extend through the same number of layers 108 of the circuit board stack 108. Moreover, the feed vias 132 and non-feed vias 134 can have the same length. In particular, in accordance with embodiments of the present disclosure, the feed vias 132 and the non-feed vias 134 can extend through the entire circuit board stack 104, from at least first surface 119 of the circuit board stack 104, on which the radiating elements 128 are disposed, to the second surface 154 of the circuit board stack 104. Moreover, the non-feed vias 134 can have a length that is equal to a length of the feed vias 132, even though, like the feed vias 132, the non-feed vias 134 are disposed in holes 174 formed along lines that are perpendicular to the first 119 and second surfaces 154 of the circuit board stack 104 and that intersect a radiating element 128. Furthermore, in accordance with at least some embodiments of the present disclosure, a feed via 132 and/or a non-feed via 134 can extend through all or a portion of a thickness t of a radiating element 128 intersected by the respective via 132 and/or 134. As a particular example, a non-feed via 134 can include a conductor 172 that extends past the first surface 119 by a distance equal to or greater than one-half the thickness t of the radiator element 128. As another example, the conductor 172 of a non-feed via 134 can extend to the first surface 119 of the circuit board stack 104. In accordance with still other embodiments of the present disclosure, a non-feed via 134 is at least as long as a feed via 132, and extends through all of the layers of the circuit board stack 108, to a level that is equal to a level of a surface of a radiating element 128.

Figure 4:
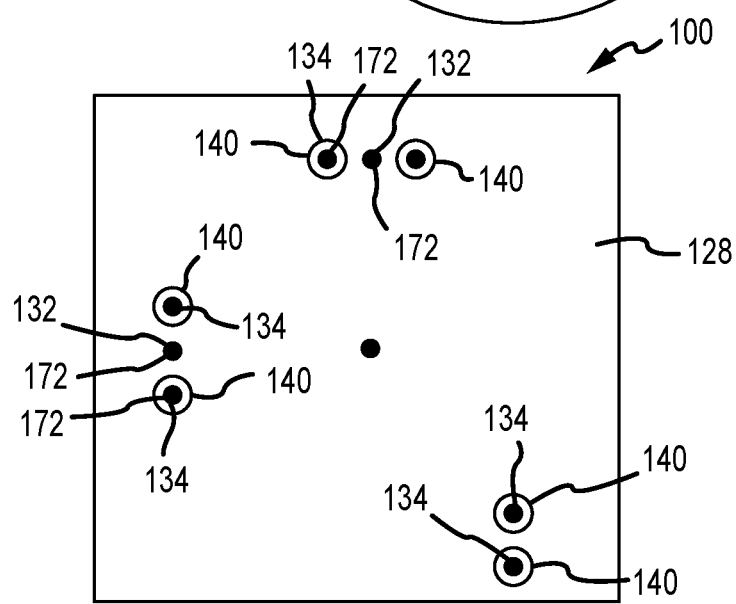
FIG. 4 is a top plan view of an antenna radiating element, a feed via, and ground vias in accordance with embodiments of the present disclosure in a plan view.

As shown in FIGS. 3 and 4, embodiments of the present disclosure provide that each non-feed via 134 formed in a hole 174 that extends along a line that intersects a radiating element 128 is received or terminated in a relieved area or aperture 140 formed in that radiating element 128. The relieved area 140 prevents direct electrical contact between the electrical conductor 172 of the non-feed via 134 and the radiating element 128. This allows a non-feed via 134 to be formed in a simple drilling step that, like a drilling step used in forming a feed via 132, creates a via or hole 174 through the entire circuit board stack 104. Moreover, by providing an aperture 140 in the radiating element that is larger than an area of a portion of the non-feed via 134 at a level in the circuit board stack 104 of the radiating element 128, the non-feed via 134 can remain electrically separate from the radiating element 128. Moreover, the non-feed via 134 can remain electrically separate from the radiating element 128 even if, as depicted in FIG. 3, the conductive material 172 of the non-feed via 134 extends beyond the first surface 119 of the circuit board on which the radiating element 128 is formed. In accordance with at least some embodiments of the present disclosure, the volume formed between the relieved area 140 and a non-feed via 134 within that relieved area 140 can be filled with a dielectric material 150. Alternatively, that volume can be left unfilled.

Figure 5:
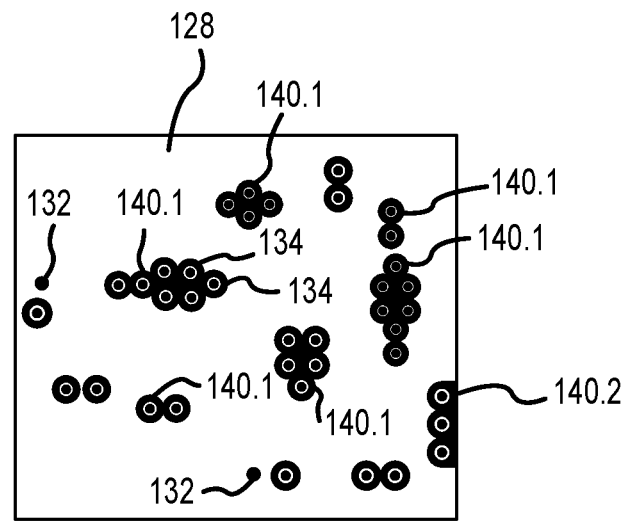
FIG. 5 is a top perspective view of an antenna radiating element in accordance with other embodiments of the present disclosure.
Figure 6:
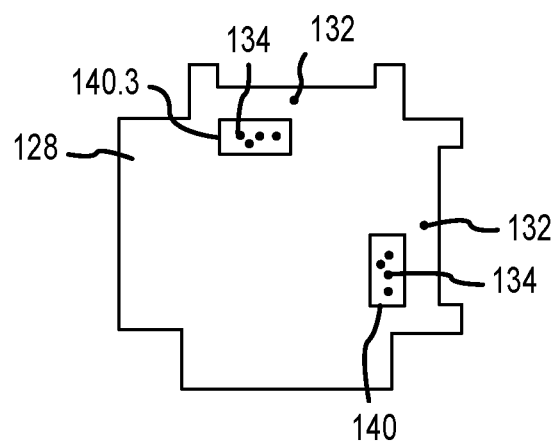
FIG. 6 is a top plan view of an antenna radiating element in accordance with other embodiments of the present disclosure.

In accordance with further embodiments of the present disclosure, and as illustrated in FIGS. 5 and 6, a single relieved area 140 can contain a plurality of non-feed vias 134. The relieved areas 140 can be conformal, for example as in conformal areas 140.1 in FIG. 5, in which the outline of the relieved area 140 is contoured such that there is a consistent gap between an edge of the relieved area and the nearest non-feed via 134 within that area 140. In accordance at least some embodiments of the present disclosure, a relieved area 140 can intersect or include an edge portion of an associated antenna element 128, in which case the relieved area 140 is not in the form of a closed aperture, as illustrated by relieved area 140.2 in FIG. 5. Alternatively or in addition, some or all of the relieved area 140 can be non-conformal, for example as illustrated by the non-conformal relieved areas 140.3 in FIG. 6. In a non-conformal relieved area 140, at least some minimum gap amount is established between the edge of the relieved area 140 and the nearest non-feed via 134.

Figure 7:
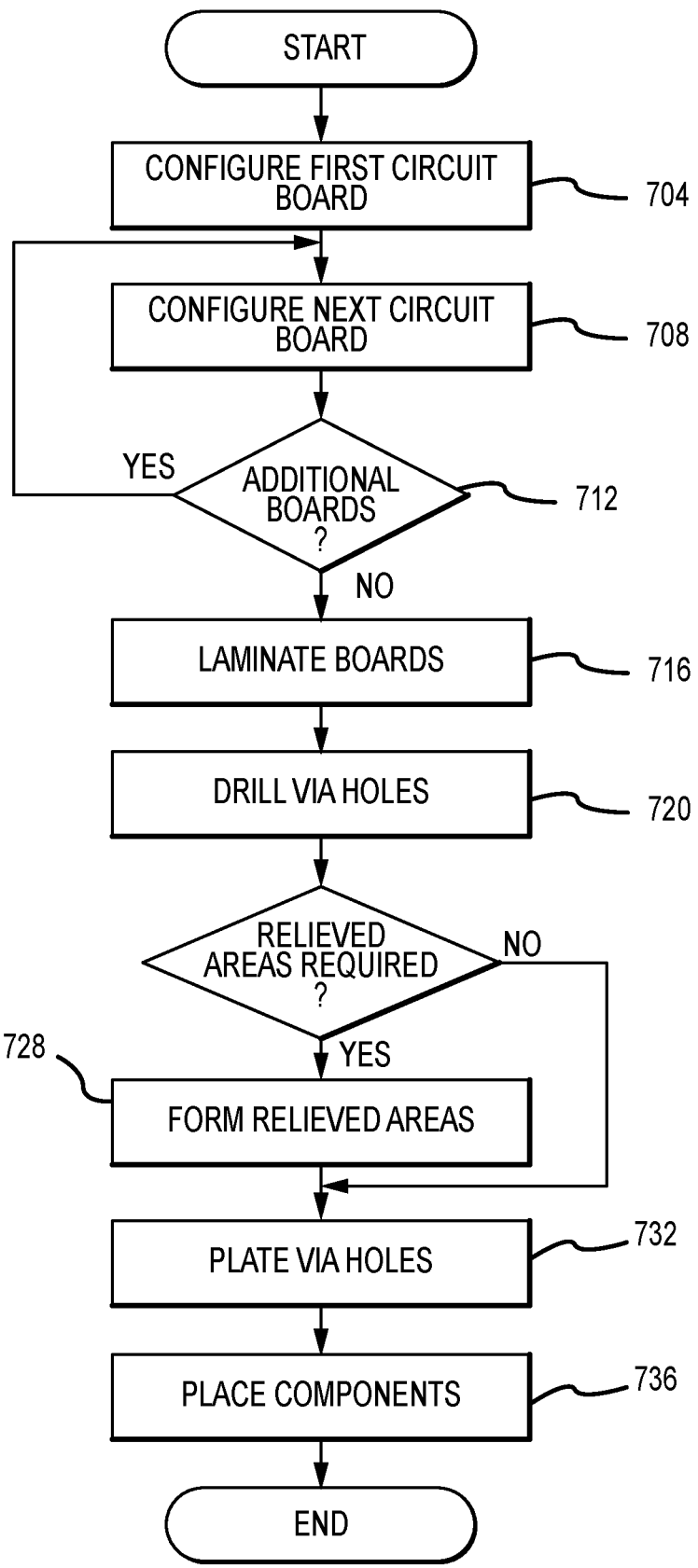
FIG. 7 is a flowchart depicting aspects of a process for forming a circuit board stack including antenna radiating elements, feed vias, and non-feed vias in accordance with embodiments of the present disclosure.

Aspects of a method for forming an antenna assembly 100 in accordance with embodiments of the present disclosure are depicted in FIG. 7. Initially, at step 704, a first circuit board 108 that will form the first surface 119 of the circuit board stack 104 is configured. Configuring the first circuit board 108 can include shaping a conductive layer 116 to form one or more radiating elements 128. Alternatively or in addition, conductive material can be placed on a surface 116 of an insulating material or substrate 112 of the first circuit board 108 that will correspond to the first surface 119 of the circuit board stack 104 to form radiating elements 128. Forming the radiator elements 128 can include forming relieved areas 140 at locations corresponding to the locations of non-feed vias 134. As can be appreciated by one of skill in the art after consideration of the present disclosure, the process used to configure the first circuit board 108 can include deposition, masking, plating, milling, etching or other processes.

At step 708, a next circuit board 108 is configured. Configuring the next circuit board 108 can include shaping a conductive layer 116 to form signal lines 120, ground planes or structures 124, conductive pads, or the like. At step 712, a determination can be made as to whether additional circuit boards 108 remain to be configured. If additional circuit boards 108 remain to be formed, the process can return to step 708. If no additional circuit boards 108 remain to be formed, the process can continue to step 716.

At step 716, the circuit boards 108 can be laminated to one another, to form a circuit board stack 104. After lamination, via holes 174 can be drilled through the circuit board stack 104 (step 720). More particularly, a feed via 132 that connects a signal line or trace 120 to a radiating element 128 in accordance with embodiments of the present disclosure can be formed by drilling a hole 174 through the radiating element 128, and through the layers 108 of the circuit board stack 104, to intersect the target signal line 120. In a typical implementation, the via hole 174 is formed so that is extends along a line that is perpendicular to the surfaces 114 of the circuit boards 108. A non-feed via 134 in the form of ground vias 136 adjacent a signal via 132 can also be formed by drilling a hole 174 through the radiating element 128, and through the layers 108 of the circuit board stack 104. In particular, a hole 174 for a ground via 136 can be placed to intersect one or more ground planes 124 or ground signal lines within the circuit board stack 104, and further can be configured to directly electrically connect to one or more of the intersected ground planes 124. A non-feed via 134 in the form of a component via 148 can be formed by drilling a hole 174 through the radiating element 128, and through the layers of the circuit board stack 104 at locations intersecting conductors 120 at various layers of the circuit board stack 104 that are to be connected. In addition, a component via 148 can be established by forming a hole that is located to provide or support electrical interconnections with non-radiating components 152. An interconnection with a non-radiating component 152 can include electrical interconnections between non-radiating components 152, interconnections between a line 120 and a non-radiating component 152, interconnections between a ground layer and a non-radiating component 152, or the like.

In accordance with embodiments of the present disclosure in which relived areas 140 are formed in a radiating element 128 as part of configuring a first circuit board 108, the material of the radiating element 128 intersected by a line along which a hole 174 for a non-feed via is to be formed will already have been removed. In that case, the material of the radiating element 128 is not removed by the process of drilling the non-feed via 134 hole 174. However, like the hole for a feed via 132, the hole 174 for the non-feed via 134 extends through all of the layers of the circuit board stack 104.

At step 724, a determination can made as to whether relieved areas 140 remain to be formed in the antenna elements 128. In particular, if relieved areas 140 were not formed in the radiating elements 128 as part of configuring the first circuit board 128, or if relieved areas 140 were formed in areas encompassing points of intersection and surrounding areas for less than all of the non-feed vias 134, relieved areas or anti-pads 140 can be formed at step 728. Forming relieved areas 140 can include various processes, such as but not limited to etching, drilling, or milling. In general, and whether or not formed when the radiating element 128 is initially formed or after a via hole 174 is formed, the relived areas 140 are formed so that a gap is maintained between the conductor 172 of the non-feed vias 134 and the radiator element 128 otherwise intersected by the non-feed via, thereby preventing a direct electrical connection between the non-feed vias 134 and the radiator element 128. Moreover, at least a minimum spacing is maintained between the conductor 172 and the nearest portion of the radiator element 128 by the relieved area 140 in order to prevent an effective electrical connection between the conductor 172 and the radiator element 128. As an example, a relieved area 140 can be conformal, such that a single non-feed-via 134 having a conductor 172 with a circular cross section is accommodated within a particular relieved area 140 that is also circular and that has a diameter that is greater than a diameter of the conductor 172 of the non-feed via 134. As another example, a spacing of at least 3 mils in all directions between a non-feed via 134 conductor 172 and the nearest portion of a radiator element 128 is established by the relieved area. In accordance with still other embodiments, a relieved area 140 is non-conformal in that at least portions of a perimeter of the relieved area 140 do not maintain a constant spacing from an edge of the conductor 172.

At step 732 the via holes 172 can be plated or filled with an electrical conductor 172. In accordance with at least some embodiments of the present disclosure, an insulating material 176 is placed between the walls of the hole 174 and the conductive material 172, at least along selected portions of the walls, in order to prevent unwanted electrically connections between the conductive material 172 and other components. In accordance with further embodiments of the present disclosure, a dielectric material 150 can be placed in the area between the conductive material 172 and an edge of the relieved area 140 in which the conductive material 172 is received or is proximate.

At step 736, any non-radiating components 152 that are to be attached to the circuit board stack 104 can be placed and connected to signal lines or vias 132 or 134 as required. The process can then end.

In accordance with embodiments of the present disclosure, the non-feed vias 134 that are not required to match or isolate the antenna element 128 are placed within a relieved area 140 in which an area of conductive material of the antenna element 128 is removed around the via's annular ring such that a gap of at least a selected minimum distance in all directions around a conductor 172 of each non-feed via 134 is established. This gap prevents unwanted coupling between the non-feed via 134 and the antenna element 128. In addition, at least some embodiments of the present disclosure include no more than six vias across the entirety of any single patch or radiating element 128 edge, as this has been shown to reduce total patch efficiency. Feed symmetric removal of material can decrease element roll-off factor and improve overall radiating element 128 matching characteristics. It is possible to run a signal through a radiating element 128 with increased RF to non-RF coupling if deemed necessary without substantially impacting RF performance. In accordance with embodiments of the present disclosure, the radiating element 128 is tuned differently than if the vias 134 did not exist within the radiating element 128. Additionally, embodiments of the present disclosure allow for up to 60% of the total radiating element 128 area to be filled with non-radiating vias 134, without substantially reducing the overall radiating element 128 efficiency. This approach allows for the radiating element 128 match to be improved by an average match across the bandwidth of greater than two times if the above criteria are not followed, and can maintain a cosine radiating element 128 roll off of factor of less than 2.2.

The present disclosure provides a method of producing flat-panel phased arrays through the use of a single drill cycle, including in printed circuit board/printed wire assembly (PCB/PWA) production processes. Traditionally phased arrays are built using connectorized modules, printed circuit board/printed wiring board (PCB/PWB) cards, or a flat panel system which radiate energy perpendicular to the PCB/PWA. Flat panel arrays often contain more expensive PCB/PWB, which have been difficult to produce. The increased complexity of flat panel phased arrays is due to their requirement for blind, buried, and/or micro vias which are known to be a prerequisite to prevent radiation and matching interference caused by power planes, signal, decoupled RF, and isolation vias.

As described herein, it is possible to create a single drill cycle flat panel phased array system through a specified set of design rules. First, all vias that are not typically required to match or isolate the antenna element 128 are terminated in or adjacent to a relieved area 140 in which conductive material around the annular ring of the non-feed via 134 has been removed. In accordance with at least some embodiments of the present disclosure, the space between the non-feed via 134 and the surrounding antenna element 128 is greater than 3 mils in all directions, in order to avoid unwanted coupling. Second, the design rules can specify a maximum number of non-feed vias 134 that can be formed along an edge of a single radiating element 128. For example, the design rules can require that there should not be more than six vias across the entirety of any single patch edge in order to maintain total patch efficiency. Third, the design rules can specify feed symmetric removal of material to decrease element roll-off factor and improve overall element matching characteristics. Alternatively, asymmetric removal can be tolerated, for example if required element matching characteristics are nonetheless met. Next, and contrary to typical practices, embodiments of the present disclosure make it possible to run a signal through a patch with increased RF to non-RF coupling if deemed necessary without substantially impacting RF performance. Finally, embodiments of the present disclosure provide that the patch be tuned differently than if the vias did not exist within the patch. As an example, embodiments of the present disclosure allow for up to 60% of the total patch area to be filled with non-radiating vias without substantially reducing the overall patch efficiency. This approach allows for the patch match to be improved by an average match across the bandwidth of greater than two times if the above criteria are not followed, and will maintain a cosine patch roll off of factor of less than 2.2.

Aspects of the present disclosure include enabling an antenna assembly or system 100 to be formed from a circuit board stack 104 in which vias are formed as continuous via holes 174 that extend from a conductive layer on one side of the circuit board stack 104 through or to an antenna element 128 on an opposite side of the circuit board stack 104. Moreover, embodiments of the present disclosure remove the need to back drill an existing via. A need for multiple drill cycles is also avoided, as only a single lamination cycle is required. Embodiments of the present disclosure thus provide an antenna system 100 that can be produced with reduced production costs by, for example, lowering the number of drill operations, removing the need for back drill operations, and eliminating the need to use conductive pastes in order to form interlayer connections.

Embodiments of the present disclosure provide an antenna system or assembly 100 that can be formed using a simplified manufacturing process. In particular, steps of back drilling, placing conductive material between circuit board layers 108, and/or partially forming via lines, or of placing non-feed vias only in areas of a circuit board stack that are not overlaid by a radiating element 128, are avoided.

The foregoing description has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described hereinabove are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. An antenna system, comprising:
   a circuit board stack;
   a radiating element, wherein the radiating element is on a first layer of the circuit board stack;
   a first non-feed via, wherein the first non-feed via extends between the radiating element and a second layer of the circuit board stack, and wherein the first non-feed via is electrically separated from the radiating element;
   a second non-feed via, wherein the second non-feed via extends between the radiating element and the second layer of the circuit board stack, and wherein the second non-feed via is electrically separated from the radiating element;
   a first relieved area formed in the radiating element, wherein the first relieved area surrounds a portion of the first non-feed via to electrically separate the first non-feed via from the radiating element; and
   a second relieved area formed in the radiating element, wherein the second relieved area surrounds a portion of the second non-feed via to electrically separate the second non-feed via from the radiating element.

2. The antenna system of claim 1, further comprising:
   a third non-feed via, wherein the third non-feed via extends between the radiating element and the second layer or a third layer of the circuit board stack, and wherein the third non-feed via is electrically separated from the radiating element;
   a fourth non-feed via, wherein the fourth non-feed via extends between the radiating element and the second layer or the third layer of the circuit board stack, and wherein the fourth non-feed via is electrically separated from the radiating element; and
   a third relieved area formed in the radiating element, wherein the third relieved area surrounds a portion of each of the third and fourth non-feed vias to electrically separate the third and fourth non-feed vias from the radiating element.

3. The antenna system of claim 2, wherein the first relieved area forms a closed aperture in the radiating element.

4. The antenna system of claim 1, further comprising:
   a feed via, wherein the feed via is electrically connected to the radiating element.

5. The antenna system of claim 4, wherein the feed via and the first non-feed via have a same length.

6. The antenna system of claim 5, wherein the first layer of the circuit board stack forms a first surface on a first side of the circuit board stack that supports the radiating element, and wherein the second layer of the circuit board stack forms a second surface on a second side of the circuit board stack.

7. The antenna system of claim 6, wherein the radiating element has a first thickness, and wherein the first non-feed via extends past the first surface of the circuit board stack by a distance that is greater than or equal to one-half the first thickness.

8. An antenna system, comprising:
   a circuit board stack, including:
      a first surface, wherein the first surface is formed by a first layer of the circuit board stack;
      a plurality of radiating elements, the plurality of radiating elements including at least first and second radiating elements disposed on the first surface;
   a second surface, wherein the second surface is formed by a second layer of the circuit board stack;
   a plurality of feed vias, including:
      a first feed via extending from the at least one of the second layer of the circuit board stack or a third layer of the circuit board stack to the first radiating element, wherein the first feed via is in electrical contact with the first radiating element; and
      a second feed via extending from the at least one of the second layer circuit board stack or the third layer of the circuit board stack to the second radiating element, wherein the second feed via is in electrical contact with the second radiating element;
   a plurality of non-feed vias, including:
      a first non-feed via extending between the first radiating element and the second layer of the circuit board stack, wherein the first non-feed via is electrically isolated from the first radiating element;
   a second non-feed via extending between the first radiating element and the second layer of the circuit board stack, wherein the second non-feed via is electrical isolated from the second first radiating element;
   a first relieved area formed in the first radiating element, wherein the first relieved area surrounds a portion of the first non-feed via to electrically separate the first non-feed via from the first radiating element; and
   a second relieved area formed in the first radiating element, wherein the second relieved area surrounds a portion of the second non-feed via to electrically separate the second non-feed via from the first radiating element.

9. The antenna system of claim 8, wherein the first radiating element includes a third relieved area, wherein the second radiating element includes a fourth relieved area, wherein the circuit board stack further includes a third non-feed via and a fourth non-feed via, wherein the third non-feed via extends from the second surface to the first radiating element, wherein the third non-feed via includes a portion that extends past the first surface and into the third relieved area, wherein the third non-feed via is electrically isolated from the first radiating element, wherein the fourth non-feed via extends from the second surface to the second radiating element, wherein the fourth non-feed via includes a portion that extends past the first surface and into the fourth relieved area, and wherein the fourth non-feed via is electrical isolated from the second radiating element.

10. The antenna system of claim 8, wherein a length of the first feed via is equal to a length of the first non-feed via, and wherein a length of the second feed via is equal to a length of the second non-feed via.

11. The antenna system of claim 8, further comprising:
a first non-radiating component on the second surface, wherein the first non-radiating component is electrically connected to the first non-feed via; and
an interconnection on an intermediate layer of the circuit board stack, wherein the intermediate layer is electrically connected to the first non-feed via.

12. The antenna system of claim 11, further comprising:
a second non-radiating component on the second surface, wherein the second non-radiating component is electrically connected to the second non-feed via, wherein the intermediate layer is electrically connected to the second non-feed via, whereby the first non-radiating component is electrically connected to the second non-radiating component.

13. A method of forming an antenna assembly, comprising:
forming a first radiating element on a first surface of a first circuit board;
forming a first signal line on a first surface of a second circuit board;
forming a second signal line on a second surface of a third circuit board;
laminating the first, second, and third circuit boards to one another;
drilling first, second, and third via holes through the first, second, and third circuit boards, wherein the first and second via holes overlap the first radiating element;
filling the first via hole with a conductive material to form a first non-feed via, wherein the first non-feed via extends between the first radiating element and a second layer of the circuit board stack;
filling the second via hole with the conductive material to form a second non-feed via, wherein the second non-feed via extends between the first radiating element and the second layer of the circuit board stack;
forming a first relieved area in the first radiating element in an area surrounding the conductive material of the first non-feed via, wherein the first non-feed via is electrically separated from the first radiating element;
forming a second relieved area in the first radiating element in an area surrounding the conductive material of the second non-feed via, wherein the second non-feed via is electrically separated from the first radiating element; and
filling the third via hole with the conductive material to form a first feed via, wherein the first feed via is electrically connected to the first radiating element.

14. The method of claim 13, further comprising:
placing a first non-radiating component on the second surface of the third circuit board, wherein the first non-radiating component is electrically connected to the first non-feed via.

15. The method of claim 13, wherein first, second, and third via holes are drilled through the first radiating element.

16. The antenna system of claim 1, wherein the first relieved area forms a closed aperture in the radiating element.

17. The antenna system of claim 1, further comprising:
a plurality of radiating elements, wherein the plurality of radiating elements includes at least first and second radiating elements, wherein the first and second non-feed vias extend between the first radiating element and the second layer of the circuit board stack, and wherein the first and second relieved areas are formed in the first radiating element;
a first feed via, wherein the first feed via is electrically connected to the first radiating element; and
a second feed via, wherein the second feed via is electrically connected to the second radiating element.

18. The antenna system of claim 17, further comprising:
a third non-feed via, wherein the third non-feed via extends between the second radiating element and the second layer of the circuit board stack, and wherein the third non-feed via is electrically separated from the second radiating element; and
a fourth non-feed via, wherein the fourth non-feed via extends between the second radiating element and the second layer of the circuit board stack, and wherein the fourth non-feed via is electrically separated from the second radiating element.

19. The antenna system of claim 18, further comprising:
a third relieved area formed in the second radiating element, wherein the third relieved area surrounds a portion of the third non-feed via to electrically separate the third non-feed via from the second radiating element.

20. The antenna system of claim 19, further comprising:
a fourth relieved area formed in the second radiating element, wherein the fourth relieved area surrounds a portion of the fourth non-feed via to electrically separate the fourth non-feed via from the second radiating element.

* * * * *